(12) United States Patent
Zhou et al.

(10) Patent No.: US 10,297,692 B2
(45) Date of Patent: May 21, 2019

(54) MANUFACTURING METHOD OF TFT SUBSTRATE AND TFT SUBSTRATE

(71) Applicant: Shenzhen China Star Optoelectronics Technology Co., Ltd., Shenzhen (CN)

(72) Inventors: Zhichao Zhou, Shenzhen (CN); Hui Xia, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/115,914

(22) PCT Filed: Jun. 23, 2016

(86) PCT No.: PCT/CN2016/086849
§ 371 (c)(1),
(2) Date: Aug. 2, 2016

(87) PCT Pub. No.: WO2017/201791
PCT Pub. Date: Nov. 30, 2017

(65) Prior Publication Data
US 2018/0108782 A1    Apr. 19, 2018

(30) Foreign Application Priority Data

May 23, 2016  (CN) .......................... 2016 1 0345315

(51) Int. Cl.
*H01L 29/786* (2006.01)
*H01L 21/02* (2006.01)
(Continued)

(52) U.S. Cl.
CPC .... *H01L 29/78642* (2013.01); *H01L 21/0274* (2013.01); *H01L 21/02271* (2013.01);
(Continued)

(58) Field of Classification Search
CPC ................................................ H01L 29/78642
(Continued)

(56) References Cited

U.S. PATENT DOCUMENTS

2011/0101355 A1    5/2011  Yamazaki
2011/0136301 A1*   6/2011  Yamazaki ......... H01L 21/28176
                                                         438/156

FOREIGN PATENT DOCUMENTS

CN             105047608 A    11/2015

* cited by examiner

*Primary Examiner* — Hsin Yi Hsieh
(74) *Attorney, Agent, or Firm* — Leong C. Lei

(57) ABSTRACT

The invention provides a manufacturing method of TFT substrate and a TFT substrate. The method provides a dual-gate structure symmetrically disposed on both sides of active layer, which prevents TFT threshold voltage from changing and improve TFT conduction state switching; by first manufacturing the active layer before the gate insulating layer to make the insulating layer directly grow on active layer, the contact interface between the gate insulating layer and active layer is improved, leading to further improving TFT conduction state switching. The TFT substrate makes the gate located between the source and the pixel electrode in vertical direction, and the dual-gate is symmetrically disposed on both sides of active layer to prevent TFT threshold voltage from changing and improve TFT conduction state switching, as well as improve the contact interface between the gate insulating layer and active layer, leading to further improving TFT conduction state switching.

10 Claims, 13 Drawing Sheets

(51) Int. Cl.
    *H01L 21/027*     (2006.01)
    *H01L 21/28*     (2006.01)
    *H01L 21/285*     (2006.01)
    *H01L 21/306*     (2006.01)
    *H01L 21/308*     (2006.01)
    *H01L 21/311*     (2006.01)
    *H01L 21/3213*     (2006.01)
    *H01L 21/443*     (2006.01)
    *H01L 21/467*     (2006.01)
    *H01L 21/4757*     (2006.01)
    *H01L 21/4763*     (2006.01)
    *H01L 23/31*     (2006.01)
    *H01L 27/12*     (2006.01)
    *H01L 29/49*     (2006.01)
    *H01L 29/66*     (2006.01)

(52) U.S. Cl.
    CPC ............... *H01L 21/28158* (2013.01); *H01L 21/28568* (2013.01); *H01L 21/3081* (2013.01); *H01L 21/30604* (2013.01); *H01L 21/31111* (2013.01); *H01L 21/31144* (2013.01); *H01L 21/32134* (2013.01); *H01L 21/32139* (2013.01); *H01L 21/443* (2013.01); *H01L 21/467* (2013.01); *H01L 21/47573* (2013.01); *H01L 21/47635* (2013.01); *H01L 23/3171* (2013.01); *H01L 27/124* (2013.01); *H01L 27/127* (2013.01); *H01L 27/1222* (2013.01); *H01L 27/1225* (2013.01); *H01L 27/1262* (2013.01); *H01L 27/1288* (2013.01); *H01L 29/4908* (2013.01); *H01L 29/6675* (2013.01); *H01L 29/66742* (2013.01); *H01L 29/66969* (2013.01); *H01L 29/78648* (2013.01); *H01L 21/0217* (2013.01); *H01L 21/02164* (2013.01)

(58) Field of Classification Search
    USPC .......................................................... 257/72
    See application file for complete search history.

MANUFACTURING METHOD OF TFT SUBSTRATE AND TFT SUBSTRATE

BACKGROUND OF THE INVENTION

1. Field of the Invention

The present invention relates to the field of display, and in particular to a manufacturing method of thin film transistor (TFT) substrate, and TFT substrate.

2. The Related Arts

As the display technology progresses, the liquid crystal display (LCD) device, due to the advantages of high display quality, low power-consumption, thin size and wide application, is widely used in mobile phones, TV, PDA, digital camera, notebook PC, desktop PC, and so on, and becomes the mainstream technology.

Currently, the LCD devices are mostly backlight LCD devices, which comprise an LCD panel and a backlight module. The operation principle of the LCD panel is to dispose liquid crystal (LC) molecules between two parallel glass substrates, with a plurality of vertical and horizontal thin wires between the two glass substrates and the electricity conduction state to control the orientation of the LC molecules to refract the light from the backlight module to generate images.

In general, the LCD panel comprises a color filter (CF) substrate, a thin film transistor (TFT) substrate, an LCD sandwiches between the CF substrate and the TFT substrate, and a sealant; whose manufacturing process comprises an array process (the middle of a box (the Cell) process (TFT substrate and the CF substrate bonding), and after the assembly process module segment (thin film, lithography, etching and stripping), a cell process (attaching TFT substrate and CF substrate), and module assembly process (driver IC and the printed circuit board lamination); wherein the array process is mainly to form TFT substrate, for controlling the LC molecules motion; the cell process is mainly to add LC between the TFT substrate and the CF substrate; and the module assembly process is mainly to laminate the driver IC and integrate the printed circuit board, so as to drive the LC molecules to rotate to generate the images.

In LCD panel industry, the known technology to manufacture TFT substrate usually uses the single gate architecture; however, the carrier transport property of the TFT substrate of single gate architecture will change after a long period of operation, and specifically, the threshold voltage will drift towards positive or negative after a long period of operation, resulting in the conduction state of the TFT, i.e. the ON and OFF of the TFT.

SUMMARY OF THE INVENTION

The object of the present invention is to provide a manufacturing method of TFT substrate, able to effectively prevent the change of threshold voltage and improve the contact interface of the gate insulating layer and the active layer to improve the conduction state of TFT.

Another object of the present invention is to provide a TFT substrate, able to effectively prevent the change of threshold voltage and improve the contact interface of the gate insulating layer and the active layer to improve the conduction state of TFT.

To achieve the above object, the present invention provides a manufacturing method of TFT substrate, which comprises: Step 1: providing a base substrate, and forming a data line and a source connected to the data line on the base substrate; Step 2: forming an active layer, the active layer being at least partially above the source; Step 3: forming a gate insulating layer on top of the active layer, the source, the data line and the base substrate, patternizing the gate insulating layer to form a first via corresponding to the active layer; Step 4: forming a first gate, a second gate and a drain, the first gate and the second gate being on the gate insulating layer and corresponding respectively to the both sides of the active layer, the drain being at least partially inside the first via and connected to the active layer through the first via; Step 5: forming a passivation layer on the drain, the first gate, the second gate and the gate insulating layer, patternizing the passivation layer to form a second via corresponding to the drain; and Step 6: forming a pixel electrode, the pixel electrode being at least partially inside the second via and connected to the drain through the second via.

Step 1 further comprises: depositing a first metal layer on the base substrate by physical vapor deposition, and using a lithography process to patternize the first metal layer to obtain the data line and the source connected to the data line; the lithography process comprising: photo-resist coating, exposure, development, and wet etching process; Step 2 further comprises: depositing a semiconductor layer on the base substrate, data line and source by chemical or physical vapor deposition, and using a lithography process to patternize the semiconductor layer to obtain the active layer; the lithography process comprising: photo-resist coating, exposure, development, and wet etching process; the data line and the source are made of one or more of the following: molybdenum, titanium, aluminum, copper; and the active layer is made of amorphous silicon, polysilicon, or a metal oxide semiconductor.

Step 3 further comprises: depositing a first insulating layer on the active layer, source, data line and base substrate by chemical vapor deposition, and using a lithography process to patternize the first insulating layer to obtain the first via corresponding to the active layer to form the gate insulating layer; the lithography process comprising: photo-resist coating, exposure, development, and wet etching process; the gate insulating layer is made of one or more of silicon oxide, and silicon nitride.

Step 4 further comprises: depositing a second metal layer on the gate insulating layer by physical vapor deposition, and using a lithography process to patternize the second metal layer to obtain the drain, the first gate and the second gate; the lithography process comprising: photo-resist coating, exposure, development, and wet etching process; the drain, the first gate and the second gate are made of one or more of the following: molybdenum, titanium, aluminum, copper.

The present invention also provides an array substrate, which comprises: a base substrate, a source disposed on the base substrate, and an active layer, a gate insulating layer, a first gate, a second gate, a drain, a passivation layer and an pixel electrode, all disposed on the source; wherein the gate insulating layer being disposed with a first via, the drain being at least partially disposed inside the first via and connected to the active layer through the first via; the first gate and the second gate being disposed between the gate insulating layer and the passivation layer and on both sides of the active layer; the passivation layer being disposed with a second via, and the pixel electrode being connected to the drain through the second via.

The base substrate is disposed with a data line, and the data line is connected to and disposed at the same layer as the source.

The first via is located above the source, and the orthographic projection of the drain on the base substrate completely covers the orthographic projection of the active layer on the base substrate.

The positions of the first gate and the second gate in the vertical direction at least partially overlap with the position of the active layer in the vertical direction.

The second via is located above the drain, and the orthographic projection of the pixel electrode on the base substrate completely covers the orthographic projections of the drain and the active layer on the base substrate.

The first gate and the second gate have the same shape, size, the position in the vertical direction, and the gap distance to the active layer in the horizontal direction.

The present invention also provides an array substrate, which comprises: a base substrate, a source disposed on the base substrate, and an active layer, a gate insulating layer, a first gate, a second gate, a drain, a passivation layer and an pixel electrode, all disposed on the source; wherein the gate insulating layer being disposed with a first via, the drain being at least partially disposed inside the first via and connected to the active layer through the first via; the first gate and the second gate being disposed between the gate insulating layer and the passivation layer and on both sides of the active layer; the passivation layer being disposed with a second via, and the pixel electrode being connected to the drain through the second via; wherein the base substrate being disposed with a data line, and the data line being connected to and disposed at the same layer as the source; wherein the first via being located above the source, and the orthographic projection of the drain on the base substrate completely covering the orthographic projection of the active layer on the base substrate.

Compared to the known techniques, the present invention provides the following advantages: the manufacturing method of TFT substrate provided by the present invention provides a dual-gate structure symmetrically disposed on both sides of the active layer, which effectively prevents the TFT threshold voltage from changing and improve the TFT conduction state switching; also, by first manufacturing the active layer before the gate insulating layer to make the insulating layer directly grow on the active layer, the contact interface between the gate insulating layer and the active layer is improve, leading to further improvement of the TFT conduction state switching. The TFT substrate provided by the present invention, unlikely the known bottom-gate or top-gate structure TFT substrate, makes the gate located between the source and the pixel electrode in the vertical direction, and uses the dual-gate structure symmetrically disposed on both sides of the active layer to effectively prevent the TFT threshold voltage from changing and improve the TFT conduction state switching, as well as improve the contact interface between the gate insulating layer and the active layer, leading to further improvement of the TFT conduction state switching.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
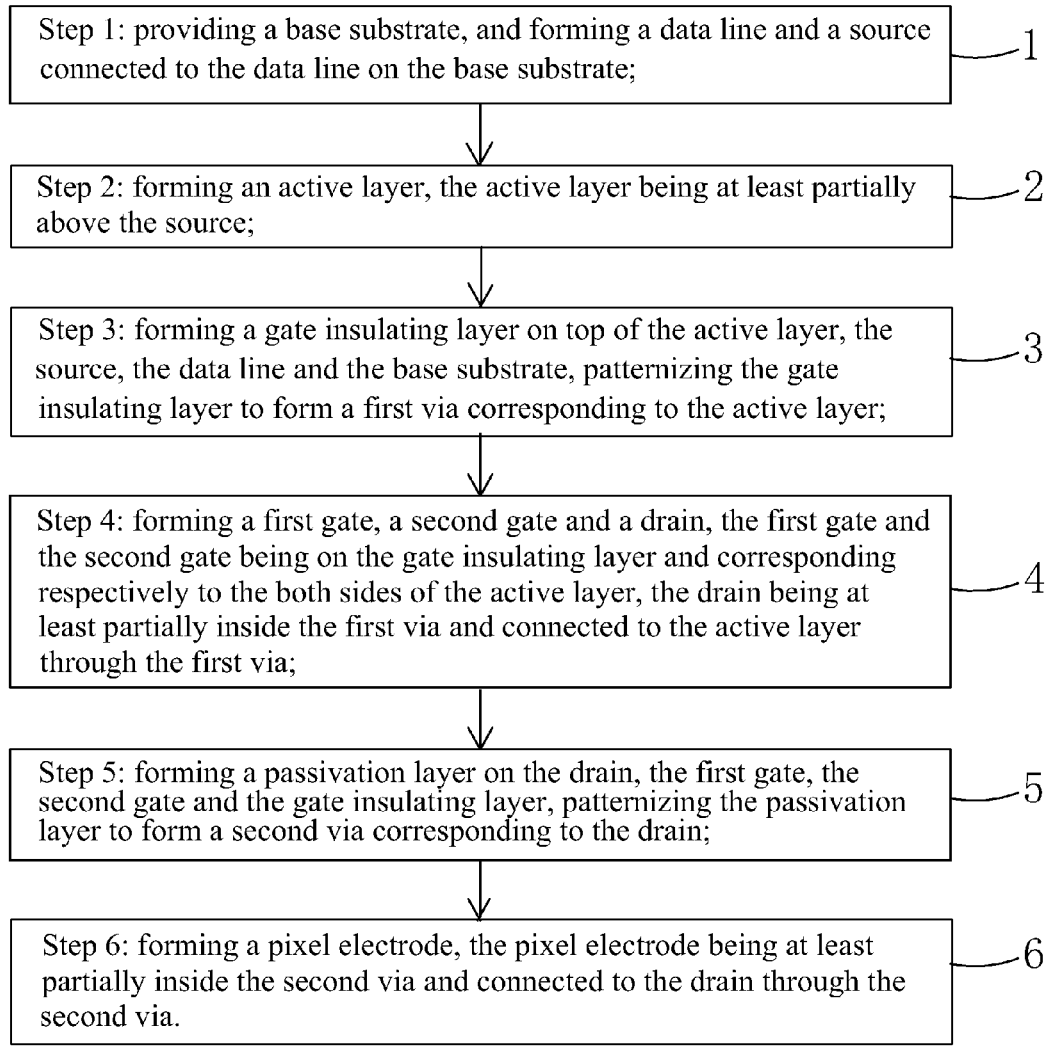
FIG. 1 is a schematic view showing the flowchart of the manufacturing method of TFT substrate provided by an embodiment of the present invention.
Figure 2A:
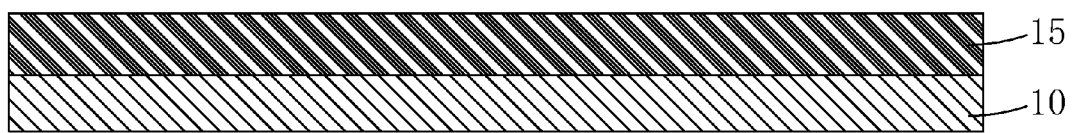
FIGS. 2A-2B are schematic views showing Step 1 of the manufacturing method of TFT substrate provided by an embodiment of the present invention.
Figure 2B:
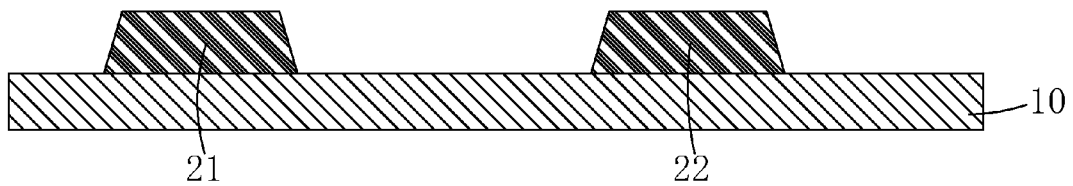
Figure 2C:
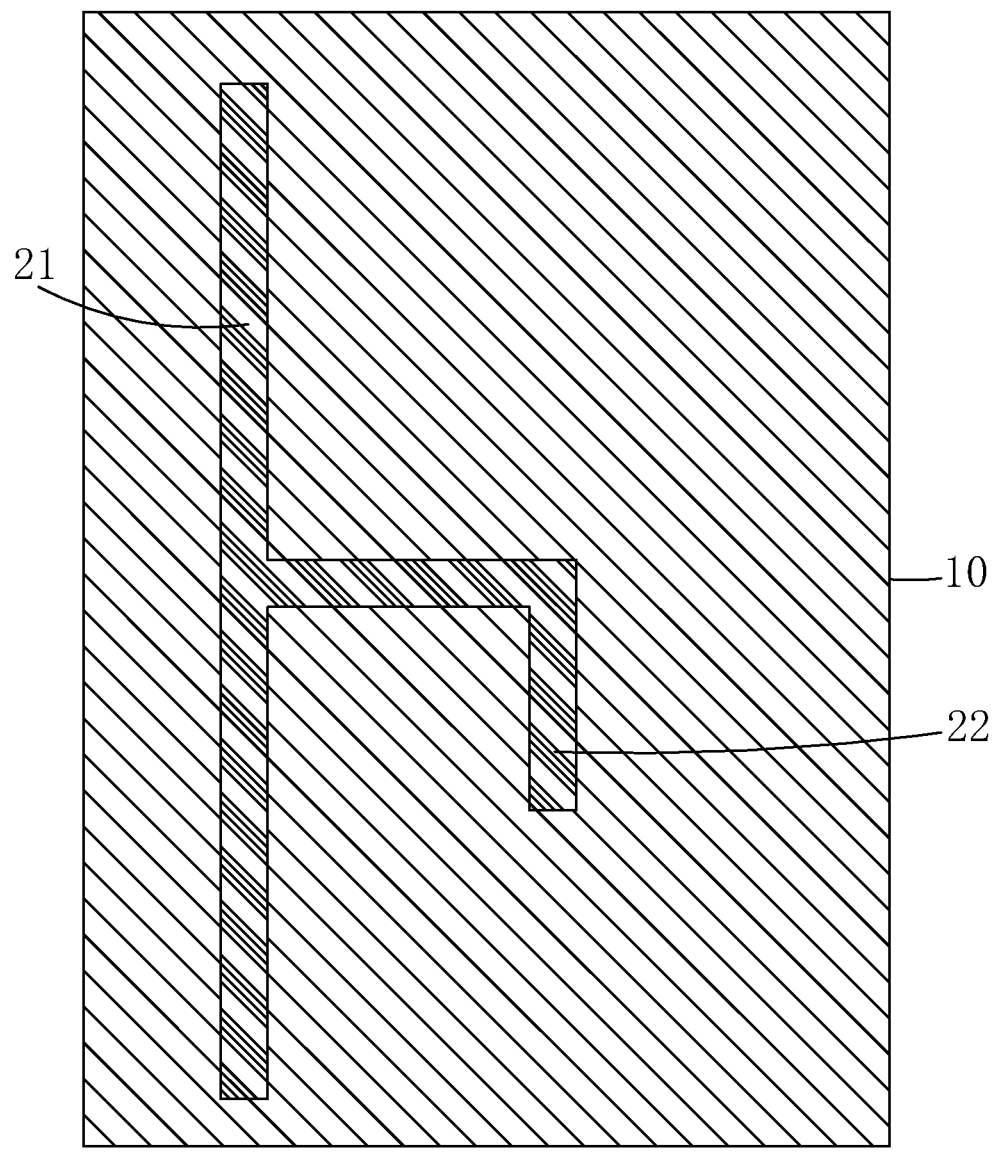
FIG. 2C is a top schematic view showing FIG. 2B.

Refer to FIG. 1 for the manufacturing method of TFT substrate provided by the present invention, which comprises:

Step 1: as shown in FIGS. 2A-2C, providing a base substrate 10, and forming a data line 21 and a source 22 connected to the data line 21 on the base substrate.

Specifically, Step 1 further comprises: depositing a first metal layer 15 on the base substrate 10 by physical vapor deposition (PVD), and using a lithography process to patternize the first metal layer 15 to obtain the data line 21 and the source 22 connected to the data line 21; the lithography process comprises: photo-resist coating, exposure, development, and wet etching process.

Specifically, the data line 21 and the source 22 are made of one or more of the following: molybdenum (Mo), titanium (Ti), aluminum (Al), copper (Cu).

Figure 3A:
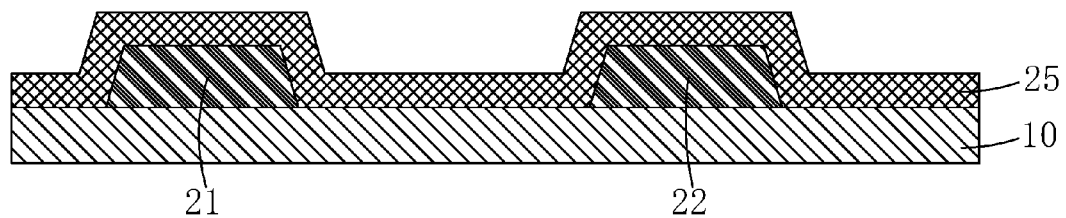
FIGS. 3A-3B are schematic views showing Step 2 of the manufacturing method of TFT substrate provided by an embodiment of the present invention.
Figure 3B:
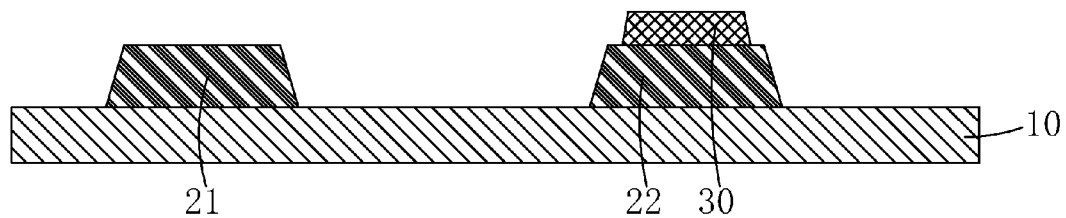
Figure 3C:
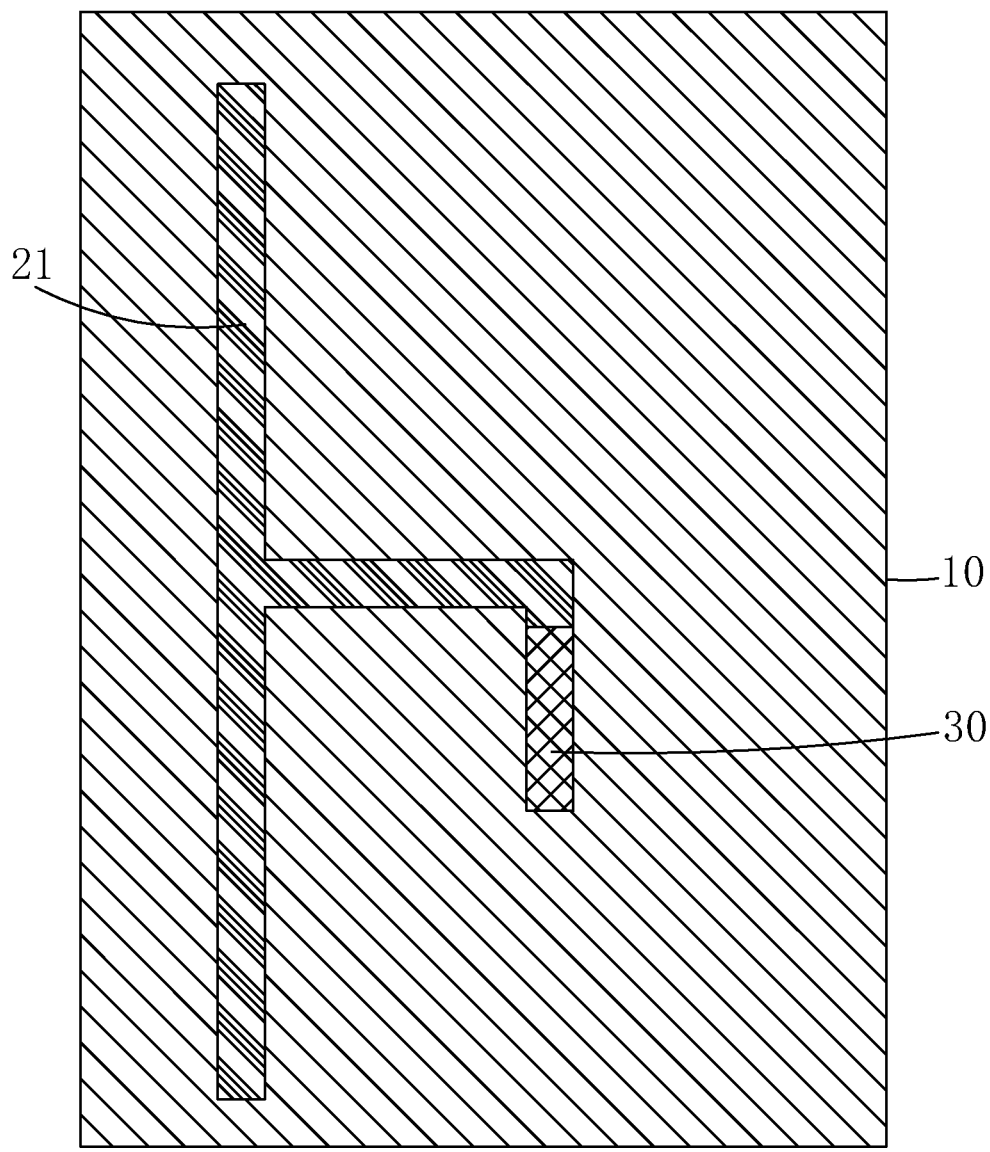
FIG. 3C is a top schematic view showing FIG. 3B.

Step 2: as shown in FIGS. 3A-3C, forming an active layer 30, the active layer 30 being at least partially above the source 22.

Specifically, Step 2 further comprises: depositing a semiconductor layer 25 on the base substrate 10, data line 21 and source 22 by chemical or physical vapor deposition (CVD or PCD), and using a lithography process to patternize the semiconductor layer 25 to obtain the active layer 30 corresponding to the source 22; the lithography process comprises: photo-resist coating, exposure, development, and wet etching process Specifically, the active layer 30 is made of amorphous silicon, polysilicon, or a metal oxide semiconductor. Preferably, the metal oxide semiconductor is indium gallium zinc oxide (IGZO).

When the active layer 30 is made of amorphous silicon or polysilicon, the VCD process is used to obtain the semiconductor layer 25, and the etching in the lithography process is dry etching.

When the active layer 30 is made of metal oxide semiconductor, the PCD process is used to obtain the semiconductor layer 25, and the etching in the lithography process is wet etching.

Figure 4A:
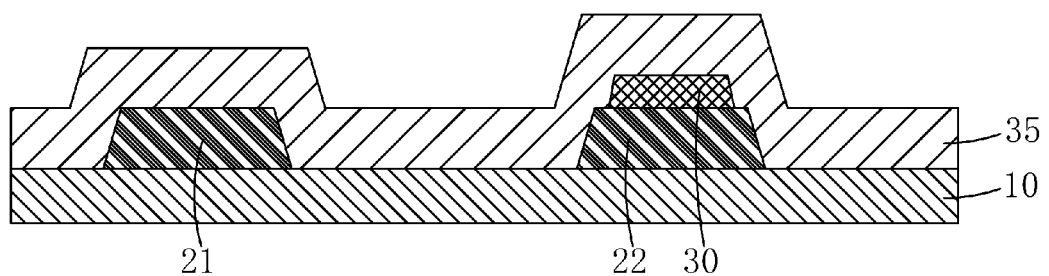
FIGS. 4A-4B are schematic views showing Step 3 of the manufacturing method of TFT substrate provided by an embodiment of the present invention.
Figure 4B:
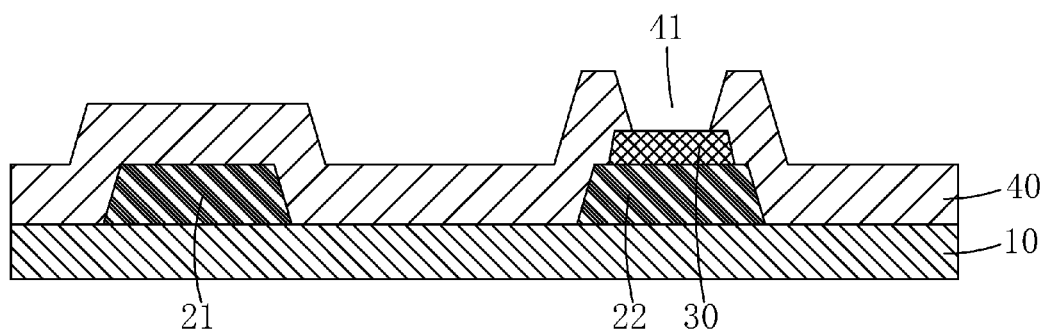
Figure 4C:
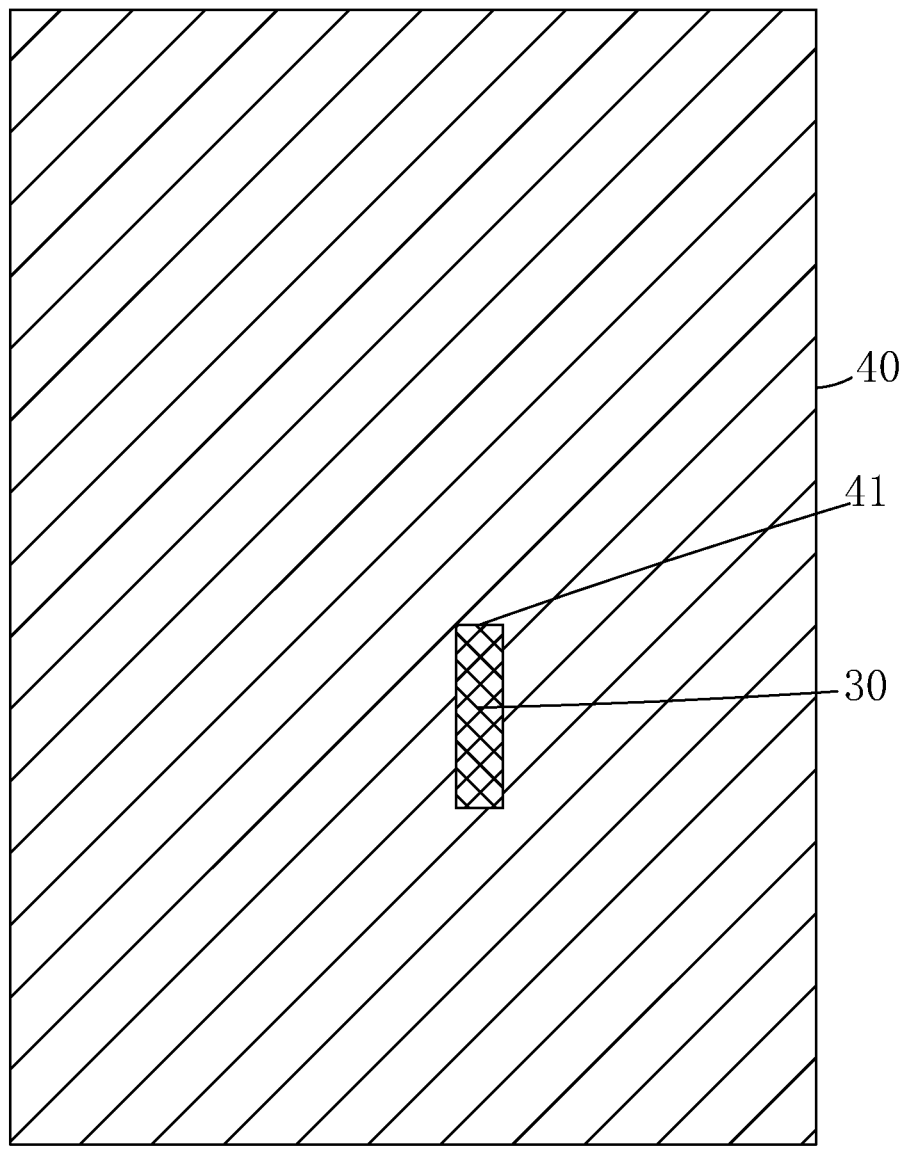
FIG. 4C is a top schematic view showing FIG. 4B.

Step 3: as shown in FIGS. 4A-4C, forming a gate insulating layer 40 on top of the active layer 30, the source 22, the data line 21 and the base substrate 10, and patternizing the gate insulating layer 40 to form a first via 41 corresponding to the active layer 30 on the gate insulating layer 40.

Specifically, Step 3 further comprises: depositing a first insulating layer 35 on the active layer 30, source 22, data line 21 and base substrate 10 by chemical vapor deposition, and using a lithography process to patternize the first insulating layer 35 to obtain the first via 41 corresponding to the active layer 30 to form gate insulating layer 40; the lithography process comprises: photo-resist coating, exposure, development, and wet etching process.

Specifically, the gate insulating layer 40 is made of one or more of silicon oxide ($SiO_x$), and silicon nitride ($SiN_x$).

Figure 5A:
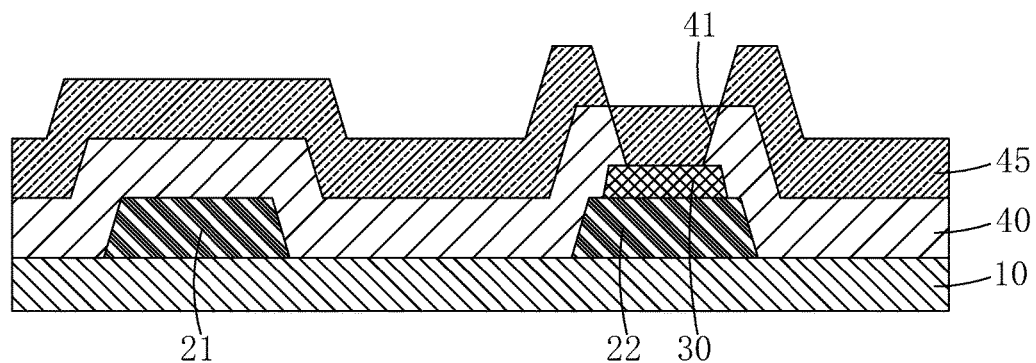
FIGS. 5A-5B are schematic views showing Step 4 of the manufacturing method of TFT substrate provided by an embodiment of the present invention.
Figure 5B:
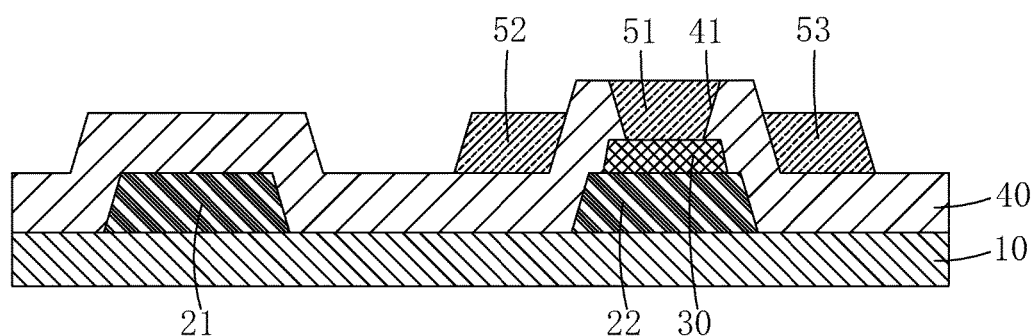
Figure 5C:
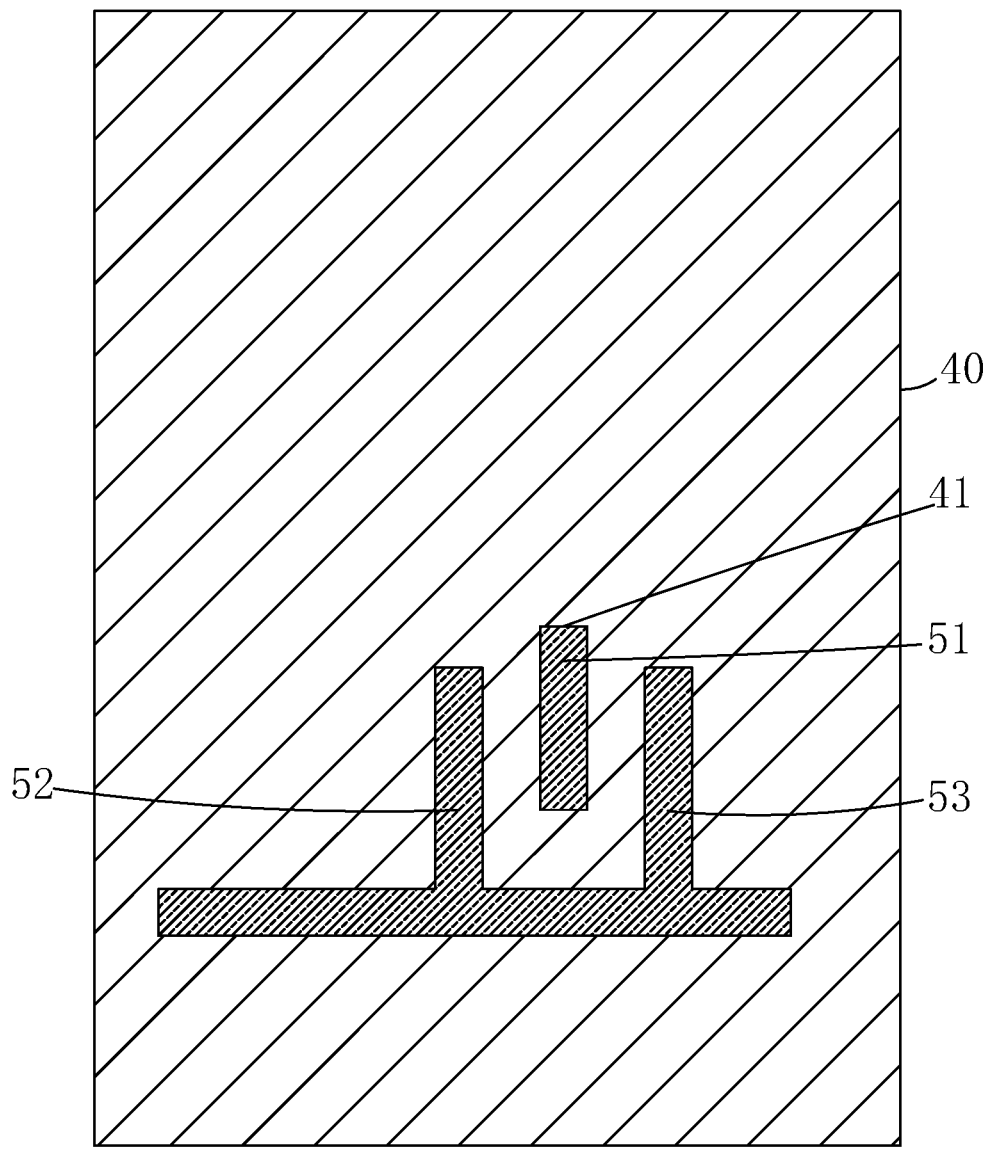
FIG. 5C is a top schematic view showing FIG. 5B.

Step 4: as shown in FIGS. 5A-5C, forming a first gate 52, a second gate 53 and a drain 51, the first gate 52 and the second gate 52 being on the gate insulating layer 40 and corresponding respectively to the both sides of the active layer 30, the drain 51 being at least partially inside the first via 41 and connected to the active layer 30 through the first via 41.

Specifically, the positions of the first gate 52 and the second gate 53 in the vertical direction at least partially overlap with the position of the active layer 30 in the vertical direction.

Preferably, the positions of the first gate 52 and the second gate 53 in the vertical direction overlap completely with the position of the active layer 30 in the vertical direction.

Preferably, the first gate 52 and the second gate 53 have the same shape, size, the position in the vertical direction, and the gap distance to the active layer 30 in the horizontal direction.

Preferably, the orthographic projection of the drain 51 on the base substrate 10 completely covers the orthographic projection of the active layer 30 on the base substrate 10.

Specifically, Step 4 further comprises: depositing a second metal 45 layer on the gate insulating layer 40 by physical vapor deposition, and using a lithography process to patternize the second metal layer 45 to obtain the drain 51, the first gate 52 and the second gate 53; the lithography process comprises: photo-resist coating, exposure, development, and wet etching process.

Specifically, the drain 51, the first gate 52 and the second gate 53 are made of one or more of the following: molybdenum (Mo), titanium (Ti), aluminum (Al), copper (Cu).

Figure 6A:
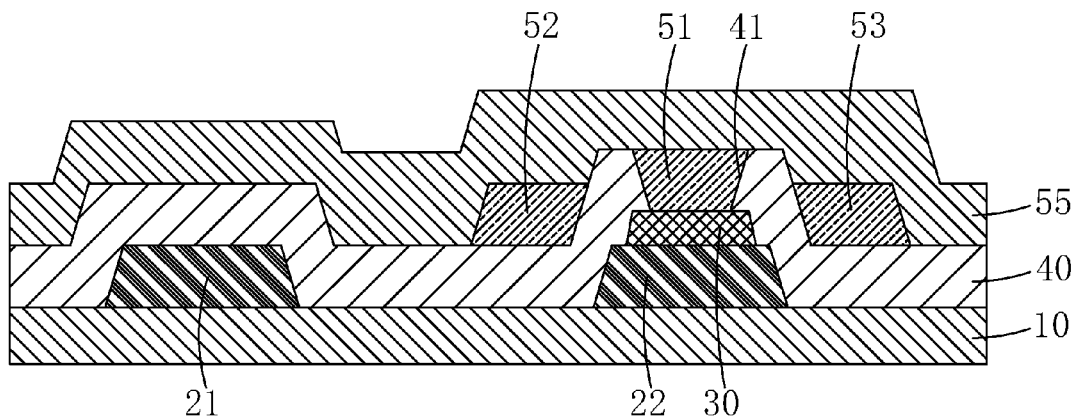
FIGS. 6A-6B are schematic views showing Step 5 of the manufacturing method of TFT substrate provided by an embodiment of the present invention.
Figure 6B:
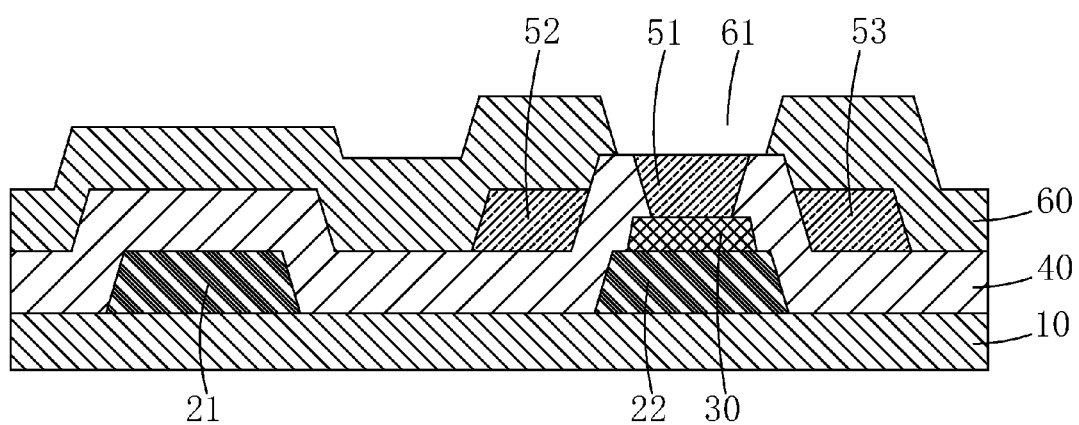
Figure 6C:
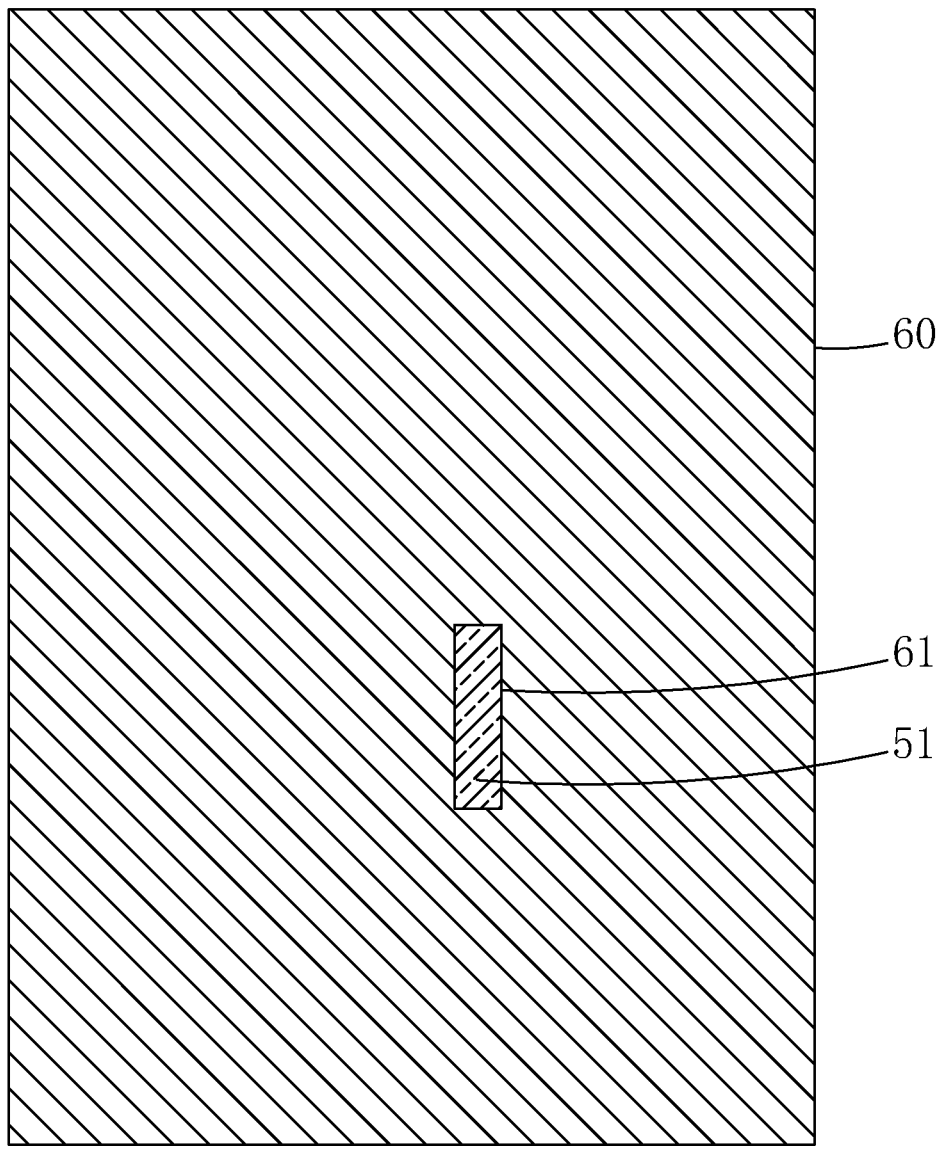
FIG. 6C is a top schematic view showing FIG. 6B.

Step 5: as shown in FIGS. 6A-6C, forming a passivation layer 60 on the drain 51, the first gate 52, the second gate 53 and the gate insulating layer 40, patternizing the passivation layer 60 to form a second via 61 corresponding to the drain 51.

Specifically, Step 5 further comprises: depositing a second insulating layer 55 on the drain 51, the first gate 52, the second gate 53 and the gate insulating layer 40 by chemical vapor deposition, and using a lithography process to patternize the second insulating layer 55 to obtain the second via 61 corresponding to the drain 51 to form the passivation layer 60; the lithography process comprises: photo-resist coating, exposure, development, and wet etching process.

Specifically, the passivation layer 60 is made of one or more of silicon oxide ($SiO_x$), and silicon nitride ($SiN_x$).

Figure 7A:
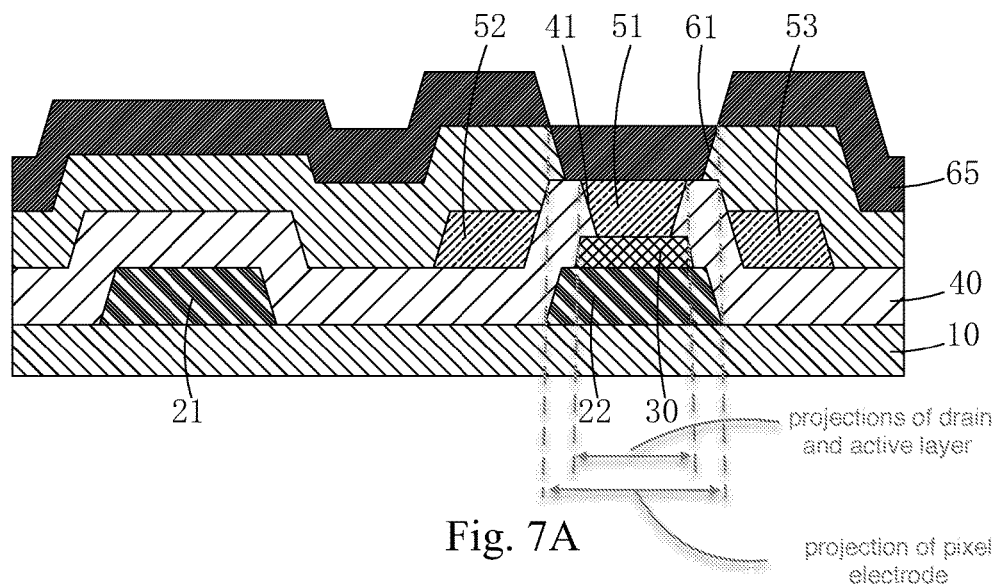
FIGS. 7A-7B are schematic views showing Step 6 of the manufacturing method of TFT substrate provided by an embodiment of the present invention.
Figure 7B:
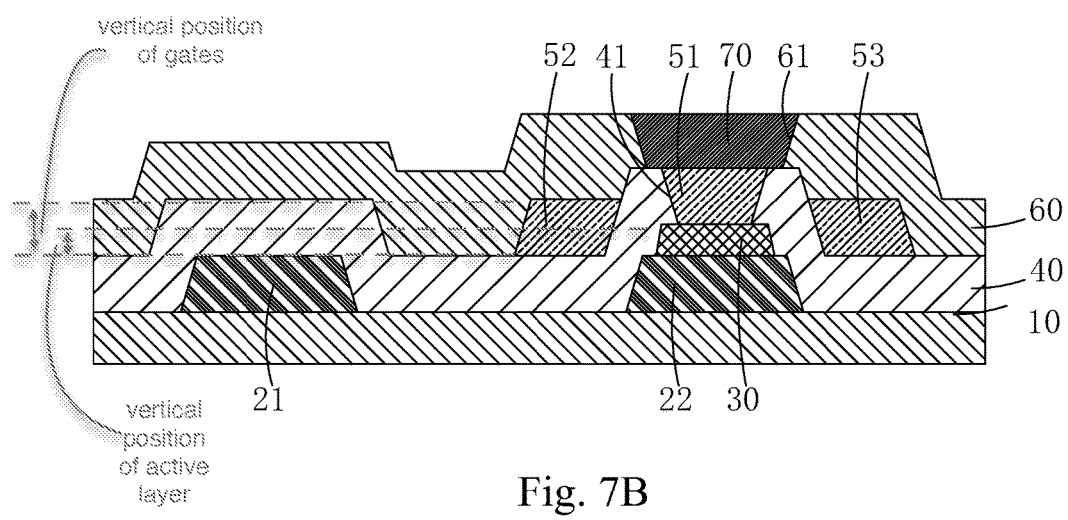
Figure 7C:
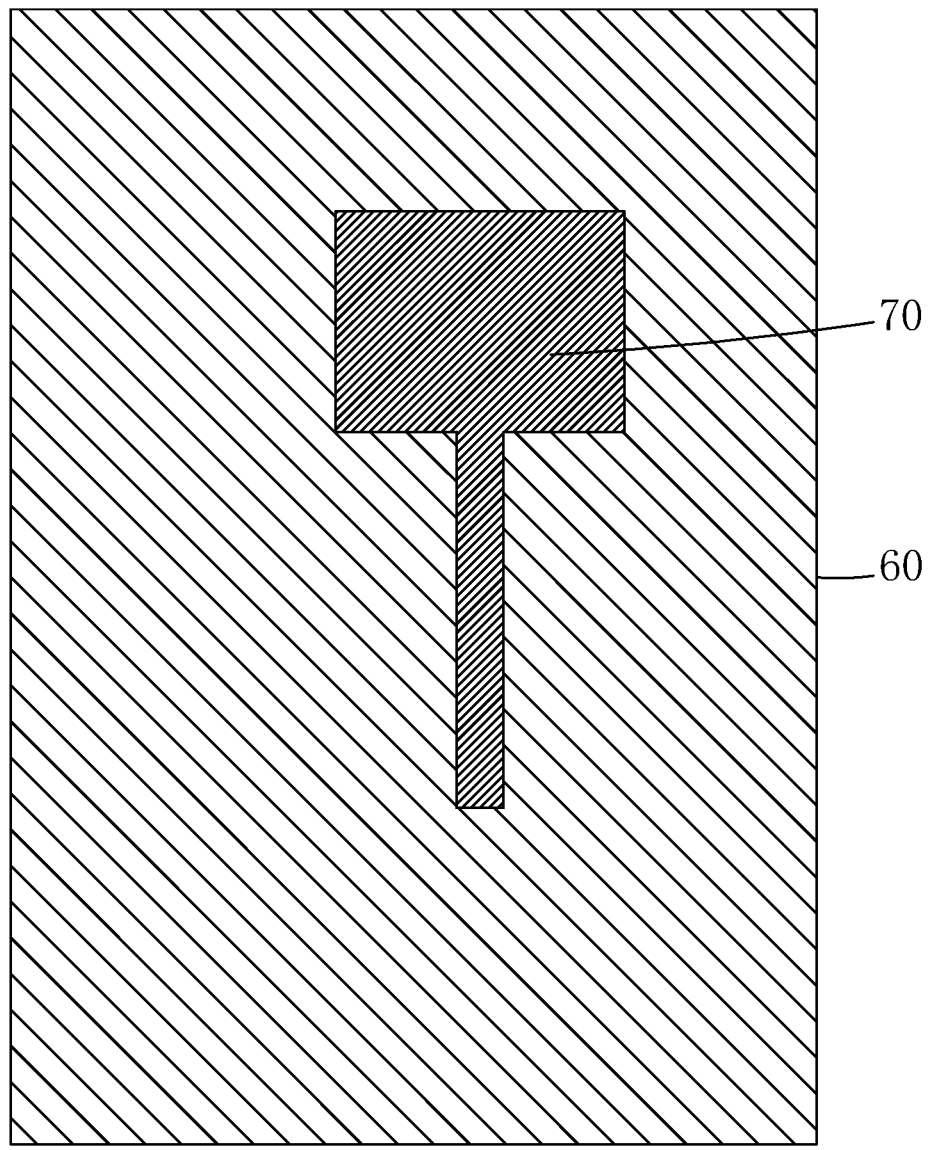
FIG. 7C is a top schematic view showing FIG. 7B.

Step 6: as shown in FIGS. 7A-7C, forming a pixel electrode 70, the pixel electrode 70 being at least partially inside the second via 61 and connected to the drain 51 through the second via 61.

Specifically, the orthographic projection of the pixel electrode 70 on the base substrate 10 completely covers the orthographic projections of the drain 51 and the active layer 30 on the base substrate 10.

At this point, the manufacturing of TFT substrate is complete.

Specifically, Step 6 further comprises: depositing a deposition conductive layer 65 on the passivation layer 60 by physical vapor deposition, and using a lithography process to patternize the deposition conductive layer 65 to obtain the pixel electrode 70; the lithography process comprises: photo-resist coating, exposure, development, and wet etching process.

Specifically, the pixel electrode 70 is made of metal or conductive metal oxide, wherein the metal is one or more of the following: molybdenum (Mo), titanium (Ti), aluminum (Al), copper (Cu), and the conductive metal oxide is preferably indium tin oxide (ITO).

In the above manufacturing method of TFT substrate, a dual-gate structure is symmetrically disposed on both sides of the active layer, so that the electric field is uniformly distributed when a voltage is applied by the dual-gate to the active layer, which effectively prevents the TFT threshold voltage from changing and improve the TFT conduction state switching; also, by first manufacturing the active layer before the gate insulating layer to make the insulating layer directly grow on the active layer, the contact interface between the gate insulating layer and the active layer is improve, leading to further improvement of the TFT conduction state switching.

Refer to FIGS. 7B-7C. The present invention also provides a TFT substrate, which comprises: a base substrate 10, a source 22 disposed on the base substrate 10, and an active layer 30, a gate insulating layer 40, a first gate 52, a second gate 53, a drain 51, a passivation layer 60 and an pixel electrode 70, all disposed on the source 22.

Wherein the gate insulating layer 40 is disposed with a first via 41, the drain 51 is at least partially disposed inside the first via 41 and connected to the active layer 30 through the first via 41; the first gate 52 and the second gate 53 are disposed between the gate insulating layer 40 and the passivation layer 60 and on both sides of the active layer 30.

The passivation layer 60 is disposed with a second via 61, and the pixel electrode 70 is connected to the drain 51 through the second via 61.

Specifically, the base substrate 10 is disposed with a data line 21, and the data line 21 is connected to and disposed at the same layer as the source 22.

Specifically, the first via 41 is located above the source 22, and the orthographic projection of the drain 51 on the base substrate 10 completely covers the orthographic projection of the active layer 30 on the base substrate 10.

Specifically, the positions of the first gate 52 and the second gate 53 in the vertical direction at least partially overlap with the position of the active layer 30 in the vertical direction.

Preferably, the positions of the first gate 52 and the second gate 53 in the vertical direction overlap completely with the position of the active layer 30 in the vertical direction.

Specifically, the second via 61 is located above the drain 51, and the orthographic projection of the pixel electrode 70 on the base substrate 10 completely covers the orthographic projection of the drain 51 on the base substrate 10.

Preferably, the first gate 52 and the second gate 53 have the same shape, size, the position in the vertical direction, and the gap distance to the active layer 30 in the horizontal direction.

Specifically, the data line 21 and the source 22 are made of one or more of the following: molybdenum (Mo), titanium (Ti), aluminum (Al), copper (Cu).

Specifically, the active layer 30 is made of amorphous silicon, or polysilicon.

Specifically, the gate insulating layer 40 is made of one or more of silicon oxide ($SiO_x$), and silicon nitride ($SiN_x$).

Specifically, the drain 51, the first gate 52 and the second gate 53 are made of one or more of the following: molybdenum (Mo), titanium (Ti), aluminum (Al), copper (Cu).

Specifically, the passivation layer 60 is made of one or more of silicon oxide ($SiO_x$), and silicon nitride ($SiN_x$).

Specifically, the pixel electrode 70 is made of metal or conductive metal oxide, wherein the metal is one or more of the following: molybdenum (Mo), titanium (Ti), aluminum (Al), copper (Cu), and the conductive metal oxide is preferably indium tin oxide (ITO).

The above TFT substrate, compared to the known bottom-gate or top-gate TFT substrate, makes the gate located between the source and the pixel electrode in the vertical direction, and uses the dual-gate structure symmetrically disposed on both sides of the active layer so that the electric field is uniformly distributed when a voltage is applied by the dual-gate to the active layer, which effectively prevents the TFT threshold voltage from changing and improve the TFT conduction state switching; also, by first manufacturing the active layer before the gate insulating layer to make the insulating layer directly grow on the active layer, the contact interface between the gate insulating layer and the active layer is improve, leading to further improvement of the TFT conduction state switching.

In summary, the present invention provides the manufacturing method of TFT substrate provided by the present invention provides a dual-gate structure symmetrically disposed on both sides of the active layer, which effectively prevents the TFT threshold voltage from changing and improve the TFT conduction state switching; also, by first manufacturing the active layer before the gate insulating layer to make the insulating layer directly grow on the active layer, the contact interface between the gate insulating layer and the active layer is improve, leading to further improvement of the TFT conduction state switching. The TFT substrate provided by the present invention, unlikely the known bottom-gate or top-gate structure TFT substrate, makes the gate located between the source and the pixel electrode in the vertical direction, and uses the dual-gate structure symmetrically disposed on both sides of the active layer to effectively prevent the TFT threshold voltage from changing and improve the TFT conduction state switching, as well as improve the contact interface between the gate insulating layer and the active layer, leading to further improvement of the TFT conduction state switching.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An array substrate, which comprises: a base substrate, a source disposed on the base substrate, and an active layer, a gate insulating layer, a first gate, a second gate, a drain, a passivation layer and an pixel electrode, all disposed on the source;

wherein the gate insulating layer is disposed with a first via, the drain being at least partially disposed inside the first via and connected to the active layer through the first via; and the first gate and the second gate are disposed between the gate insulating layer and the passivation layer and located on opposite sides of the active layer in a horizontal direction;

wherein the passivation layer is disposed with a second via, and the pixel electrode is connected to the drain through the second via; and wherein a part of the drain that is disposed in the first via is in direct contact with the active layer to connect the drain to the active layer.

2. The array substrate as claimed in claim 1, wherein the base substrate is disposed with a data line, and the data line is connected to and disposed at the same layer as the source.

3. The array substrate as claimed in claim 1, wherein the first via is located above the source, and the orthographic projection of the drain on the base substrate completely covers the orthographic projection of the active layer on the base substrate.

4. The array substrate as claimed in claim 1, wherein the positions of the first gate and the second gate in a vertical direction at least partially overlap with the position of the active layer in the vertical direction.

5. The array substrate as claimed in claim 1, wherein the second via is located above the drain, and the orthographic projection of the pixel electrode on the base substrate completely covers the orthographic projections of the drain and the active layer on the base substrate.

6. The array substrate as claimed in claim 4, wherein the first gate and the second gate have identical shapes, identical sizes, and identical positions in the vertical direction, and the first gate and the second gate are spaced from the active layer in the horizontal direction by identical distances.

7. An array substrate, which comprises: a base substrate, a source disposed on the base substrate, and an active layer, a gate insulating layer, a first gate, a second gate, a drain, a passivation layer and an pixel electrode, all disposed on the source;

wherein the gate insulating layer is disposed with a first via, the drain being at least partially disposed inside the first via and connected to the active layer through the first via; and the first gate and the second gate are disposed between the gate insulating layer and the passivation layer and located on opposite sides of the active layer in a horizontal direction;

wherein the passivation layer is disposed with a second via, and the pixel electrode is connected to the drain through the second via;

wherein the base substrate is disposed with a data line, and the data line is connected to and disposed at the same layer as the source;

wherein the first via is located above the source, and the orthographic projection of the drain on the base substrate completely covers the orthographic projection of the active layer on the base substrate; and wherein a part of the drain that is disposed in the first via is in direct contact with the active layer to connect the drain to the active layer.

8. The array substrate as claimed in claim 7, wherein the positions of the first gate and the second gate in a vertical direction at least partially overlap with the position of the active layer in the vertical direction.

9. The array substrate as claimed in claim 7, wherein the second via is located above the drain, and the orthographic projection of the pixel electrode on the base substrate completely covers the orthographic projections of the drain and the active layer on the base substrate.

10. The array substrate as claimed in claim 8, wherein the first gate and the second gate have identical shapes, identical sizes, and identical positions in the vertical direction, and the first gate and the second gate are spaced from the active layer in the horizontal direction by identical distances.

* * * * *